United States Patent
Miyazaki (10) Patent No.: US 6,597,070 B2
(45) Date of Patent: Jul. 22, 2003

(54) SEMICONDUCTOR DEVICE AND METHOD OF MANUFACTURING THE SAME

(75) Inventor: Takashi Miyazaki, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 39 days.

(21) Appl. No.: 09/770,458

(22) Filed: Jan. 29, 2001

(65) Prior Publication Data

US 2001/0010945 A1 Aug. 2, 2001

(30) Foreign Application Priority Data

Feb. 1, 2000 (JP) ........................................ 2000-024094

(51) Int. Cl.[7] ............................................. G01L 23/48
(52) U.S. Cl. ...................... 257/778; 257/690; 257/696; 257/734; 257/737
(58) Field of Search ................. 257/778, 774, 257/706, 690, 781, 734, 696, 737; 438/622, 613, 106, 110, 108, 667, 127

(56) References Cited

U.S. PATENT DOCUMENTS

| | | | | |
|---|---|---|---|---|
| 5,473,814 | A | * 12/1995 | White ........................ | 29/840 |
| 5,767,575 | A | * 6/1998 | Lan et al. ..................... | 257/701 |
| 5,920,126 | A | * 7/1999 | Sohara ........................ | 257/667 |
| 6,384,485 | B1 | * 5/2002 | Matsushima ................. | 257/774 |
| 6,445,075 | B1 | * 9/2002 | Scanlan et al. ............... | 257/78 |
| 2002/0011664 | A1 | * 1/2002 | Tanaka ........................ | 257/734 |
| 2002/0064935 | A1 | * 5/2002 | Honda ........................ | 438/622 |

FOREIGN PATENT DOCUMENTS

| JP | 8-46121 | 2/1996 |
|---|---|---|
| JP | A 9-219421 | 8/1997 |
| JP | A 11-214434 | 8/1999 |
| JP | 11-312764 | 11/1999 |
| JP | A 2000-22026 | 1/2000 |
| JP | A 2000-31189 | 1/2000 |
| JP | A 2000-228417 | 8/2000 |

OTHER PUBLICATIONS

Wang, et al "Recent Advances in Underfill Technology for Flip–Chip, Ball Grid Array, and Chip Scale Package Applications", 2000, IEEE, 2000 Int'l Symp on Electronic Materials & Pacakaging, pp. 224–231.*

Shimoe, et al Influences of Fan–in/Fan–out Structure and Underfill Fillet on TCT Reliability of Flip Chip BGA, 1998, IEEE, 36th Annual International Reliability Physics Symposium, pp. 254–259.*

Joiner, et al "Thermal Performance of Flip Chip Ball Grid Array Packages", 2002, IEEE, 18th IEEE Semi–Therm Symposium, pp. 50–56.*

* cited by examiner

Primary Examiner—Michael S. Lebentritt
(74) Attorney, Agent, or Firm—Young & Thompson

(57) ABSTRACT

A semiconductor device includes a passivation film (19) having opening portions through which an electrode pads (18) formed on a semiconductor chip (21) are exposed, projecting electrode portions (20) whose one end faces are connected to the electrode pads (18) through the opening portions, post electrode portions (16A) through which the other end faces of the projecting electrode portions (20) and the metal bumps (26) are connected to each other, and an insulating resin layer (13) having elasticity which covers the post electrode portions (16A), the projecting electrode portions (20) and the passivation film (19) with the exception of the end faces of the post electrode portions (16A).

11 Claims, 6 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and particularly to a semiconductor device which has a structure to avoid damages or the like of metal bumps due to differential thermal expansion and a method of manufacturing the same.

2. Description of the Related Art

In recent semiconductor devices, high integration of semiconductor chips to be contained in these semiconductor devices have brought effects of miniaturizing and thinning the semiconductor devices themselves, and higher performance and higher operating speed of electronic equipment have been promoted. Further, in order to satisfy requirements of enhancing the performance, reducing the size and weight and increasing the operating speed in electronic equipment to be contained in semiconductor devices, new types of packages have been developed. For example, a package based on FCBGA (flip chip ball grid array) system in which highly densely packing can be performed has appeared in the market.

Figure 10A:
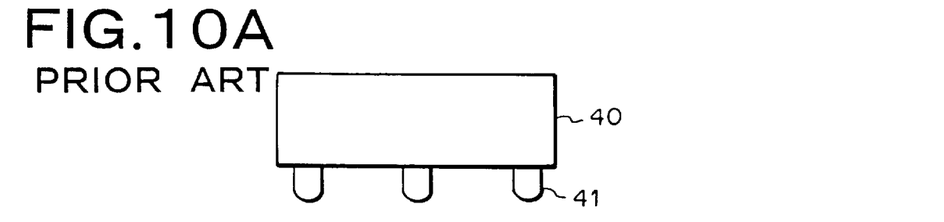
FIG. 10A shows a semiconductor chip.
Figure 10B:
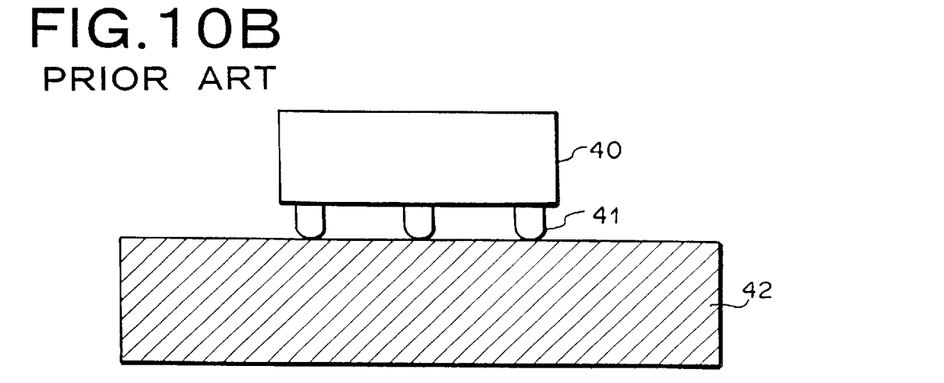
FIG. 10B shows a mount state of the semiconductor chip.

FIGS. 10A to 10D are side views showing a semiconductor device based on the FCBGA system. FIG. 10A shows a semiconductor chip, and FIG. 10B shows the mount state of the semiconductor chip. A semiconductor chip 40 has a plurality of electrode pads which are disposed in a predetermined arrangement on the peripheral portion thereof or on an active region, and metal bumps 41 are mounted on the respective electrode pads (FIG. 10A). At the final user side, the semiconductor chip 40 is mounted on a multi-layered wiring board (mount board) 42 having electrodes which are arranged in the same pattern as the bump arrangement pattern (FIG. 10B).

In general, when metal bumps 41 are formed of solder balls, the solder balls are reflowed under a predetermined temperature and fixed to the multi-layered board 42. At this time, stress and strain occurs due to differential thermal expansion (the difference of coefficients of thermal expansion) between the semiconductor chip 40 and the multi-layered wiring board 42, and thus the mount reliability is lost. In order to solve this problem, the following countermeasure is taken.

For example, aluminum nitride (AlN), mullite, ceramic materials such as glass ceramics, etc., which are expensive in price, may be used as materials of the multi-layered wiring board 42. With these materials, the coefficient of linear expansion of the multi-layered wiring board 42 is approached to that of silicon which mainly constitutes the semiconductor chip 40, whereby the mismatch of the coefficients of linear expansion is minimized to enhance the mounting reliability. This countermeasure is effective from the viewpoint of the enhancement of the mounting reliability. However, the materials of the multi-layered wiring board 42 are expensive in price, and thus the use thereof is limited to an expensive apparatus such as a super computer, a large-scale computer or the like.

In view of the foregoing situation, there has been developed such a technique that a multi-layered board using an organic material which is relatively low in price and has a large coefficient of linear expansion is used for device mounting, and an under fill resin is inserted between the multi-layered wiring board and a semiconductor chip to disperse shearing stress acting on bump connection portions, thereby reducing the stress and strain and enhancing the mounting reliability.

In the technique using the organic materials as described above, a cheap multi-layered wiring board can be used. However, when voids exist in the under fill resin or when the adhesion at the interface between the under fill resin and the semiconductor chip or the interface between the under fill resin and the multi-layered wiring board is degraded, an interface exfoliating phenomenon is induced in the reflow step, resulting in production of failed products.

Figure 10C:
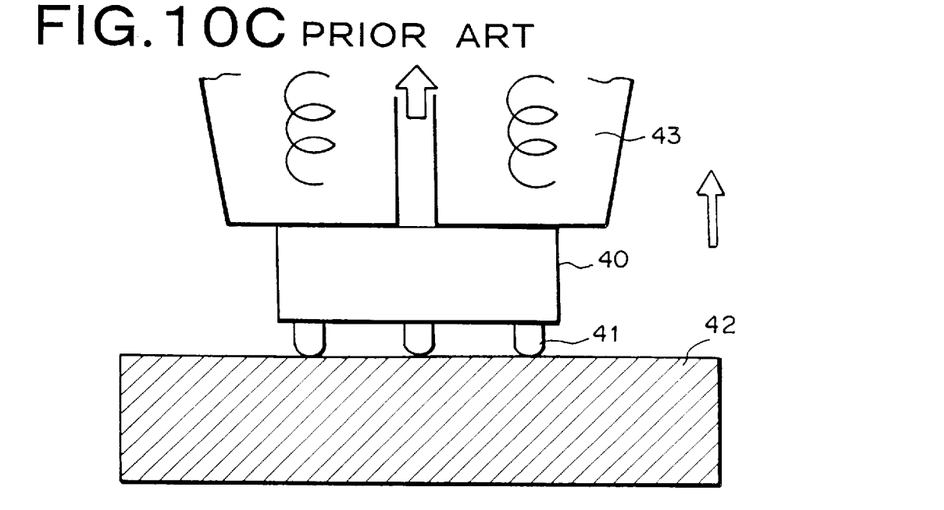
FIG. 10C shows a state where the semiconductor chip is being removed.

The FCBGA type packages are generally used for large scale semiconductor integrated circuits (LSI) having high performance, however, the products are expensive. Therefore, when failed components other than semiconductor chips are detected in an electrically screening step after the semiconductor chips are mounted, the semiconductor chips are removed from the multi-layered wiring board and re-used. This semiconductor chip removing step needs a work of heating a good-quality semiconductor chip 40 which is sucked from the back side by a suction heating tool 43 as shown in FIG. 10C, pulling up the semiconductor chip 40 while melting the bump joint portions thereof and removing the semiconductor chip 40 from the multi-layered wiring board 42.

Figure 10D:
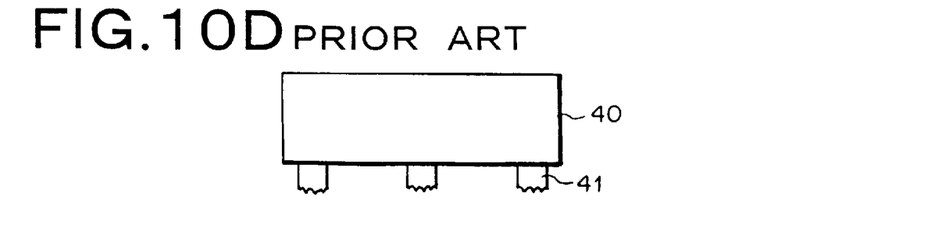
FIG. 10D shows the state of the semiconductor chip after it is removed from a mounting board.

At the time when the semiconductor chip 40 is removed, a metal bump 41 is damaged as shown in FIG. 10D, however, the chip body itself is not damaged. In the case of a semiconductor device designed so that the under fill resin is interposed between the semiconductor chip 40 and the multi-layered wiring board 42, not only the metal bump 41 is damaged, but also the peripheral devices containing the multi-layered wiring board 42 and a passivation film for protecting the active region of the semiconductor chip are damaged. In this case, the recycling of the semiconductor chip 40 is substantially impossible. Therefore, even when a cheap multi-layered wiring board formed of organic material is used, the cost is not necessarily lowered.

SUMMARY OF THE INVENTION

The present invention has been implemented in view of the foregoing situation, and has an object to provide a semiconductor device and a method of manufacturing the same in which deforming stress acting on a metal bump is moderated with no under fill resin between a semiconductor chip and a multi-layered wiring board (mounting board) to thereby enhance the mounting reliability of the semiconductor chip, and also peripheral devices containing the mounting board, etc. are avoided from being damaged in a recycling step, thereby reducing the manufacturing cost.

In order to attain the above object, according to a first aspect of the present invention, a semiconductor device in which electrode pads formed on a semiconductor chip is connected to corresponding electrodes on a mounting board through metal bumps, is characterized by including: a passivation film which is formed in the semiconductor chip and has opening portions through which the electrode pads are exposed; first conductive members whose one end faces are connected to the electrode pads through the opening portions; second conductive members through which the other end faces of the first conductive members and the metal bumps are connected to one another; and an insulating resin layer having elasticity which covers the first conductive members, the second conductive members and the passivation film with the exception of the end faces of the second conductive members.

In the semiconductor device of the present invention, irrespective of no provision of under fill resin between the semiconductor chip and the mounting board, deforming stress acting on the metal bumps can be effectively absorbed/relaxed by the first conductive members and the second conductive members connected thereto both embedded in the elastic insulating resin layer, thereby enhancing the mounting reliability. Further, damages imposed on the peripheral devices containing the mounting board, etc. in the recycling step can be avoided, and semiconductor chips can be recycled when cheap mounting boards formed of organic materials are used, so that the manufacturing cost can be lowered.

Here, the metal bumps may be formed of solder added with metal materials containing Ag. With these materials, the coefficient of expansion of the metal bumps is adjusted to further improve the stress relaxation and thus further enhance the mounting reliability of the semiconductor device.

Further, it is preferable that each of the second conductive members is designed in a multi-stage structure having plural stages which are different in coefficient of thermal expansion from one another. In this case, the stress occurring between the semiconductor chip and the mounting board can be stepwise relaxed, and the mounting reliability is further enhanced.

Still further, it is preferable that each of the second conductive members is designed in a multi-stage structure having plural stages and the insulating resin layer is also designed in a multi-layer structure, the respective stages of each of the second conductive member being covered by the respective layers of the insulating resin layer. In this case, the multi-layered structure of protection film can be obtained by the plural insulating resin layers, so that the passivation film on the semiconductor chip and the active region surface below the passivation film can be protected from heat and mechanical stress occurring in the recycling step. Therefore, a semiconductor device which can be easily recycled can be achieved. Further, since each of the second conductive members is designed in the multi-stage arrangement, structures which are high in height can be obtained as external terminals. Therefore, when the semiconductor device of the present invention is mounted on the mounting board at the final user side, the standoff height between the mounting board and the semiconductor chip can be set to a high value, so that an excellent stress relaxation effect can be achieved.

Specifically, the insulating resin layer covering the second conductive members at the first stage which are brought into contact with the other end faces of the first conductive members may be formed of material mainly containing epoxy resin, silicone resin, polyimide resin, polyolefine resin, cyanate ester resin, phenol resin, naphthalene resin or fluorene resin. Further, the insulating resin layer covering the second conductive members at the second and higher stages subsequent to the first stage may be formed of an insulating stress-relaxing resin mainly containing epoxy resin, silicone resin, polyimide resin, polyolefine resin, cyanate ester resin, phenol resin, naphthalene resin or fluorene resin. With these materials, an insulating resin layer which can excellently absorb the deforming stress acting on the metal bumps.

A heat spreader may be fixed to the opposite surface to the electrode-pad forming surface of the semiconductor chip through heat dissipating adhesive agent. In this case, the thermal characteristic of the semiconductor device can be enhanced.

Specifically, the heat spreader may be formed of metal material containing Cu, Al, W, Mo, Fe, Ni or Cr as a main component, or ceramic material containing alumina, AlN, SiC, BN or mullite.

Further, the heat dissipating adhesive agent may be formed of material mainly containing epoxy resin, silicone resin, polyimide resin, polyolefine resin, cyanate ester resin, phenol resin, naphthalene resin or fluorene resin, or material containing Ag, Pd, Cu, Al, Au, Mo, W, diamond, alumina, AlN, mullite, BN or SiC.

According to a second aspect of the present invention, a method of manufacturing a semiconductor device in which electrode pads exposed from a passivation film formed in a semiconductor chip are connected to corresponding electrodes of a mounting board through metal bumps, is characterized by comprising the steps of: forming on the surface of a metal plate a resist film which is subjected to a patterning treatment for preparing a pattern corresponding to the pattern of the electrode pads of the semiconductor chip; selectively etching the metal plate with the resist film used as a mask to achieve a temporary board having plural metal posts projecting from the bottom portion thereof; connecting first conductive members formed on the electrode pads to the metal posts of the temporary board; disposing an insulating resin layer having elasticity between the semiconductor chip and the temporary board; removing the bottom portion of the temporary board to convert the metal posts into second conductive members whose end faces are exposed from the insulating resin layer; and mounting the metal bumps on the exposed end faces of the second conductive members.

According to the semiconductor device manufacturing method of the present invention, there is provided a semiconductor device in which, irrespective of no provision of the under fill resin between the semiconductor chip and the mounting board, deforming stress acting on the metal bumps can be effectively absorbed/relaxed by the first conductive members and the second conductive members connected thereto both embedded in the elastic insulating resin layer, so that the mounting reliability can be enhanced.

Here, the metal plate may be formed of a clad metal plate in which a first metal layer and a second metal layer are joined to each other, and by the selective etching treatment, the first metal layer may be converted into the metal posts while the second metal layer is converted into the bottom portion of the temporary board. In this case, the plural metal posts can be easily obtained by preparing one clad metal plate.

It is preferable that the metal plate is formed of a clad metal plate in which first and second metal layers which are mutually different in coefficient of thermal expansion are joined to a base metal layer, and by the selective etching treatment, the first metal layer and the second metal layer are converted into the metal posts while the base metal layer is converted into the bottom portion. In this case, since the first and second metal layers to be converted into the metal posts are mutually different in coefficient of thermal expansion from each other, the stress occurring between the semiconductor chip and the mounting board can be stepwise relaxed, and the mounting reliability can be further enhanced.

Specifically, the first metal layer may be formed of Cu, Ni or the alloy material of Cu and Ni. In this case, solder wettability of the metal posts completed can be made excellent, so that the connection work of the metal posts with the first conductive members is easily performed.

It is preferable that the second conductive members are designed in a multi-stage structure having plural stages and the insulating resin layer is also designed in a multi-layer structure, the respective stages of the second conductive members being covered by the respective layers of the insulating resin layer. In this case, the multi-layered structure of the protection film can be obtained by the plural insulating resin layers, so that the passivation film on the semiconductor chip and the active region surface below the passivation film can be protected from heat and mechanical stress occurring in the recycling step. Therefore, a semiconductor device which can be easily recycled can be achieved. Further, the second conductive members are designed in the multi-stage arrangement, whereby structures which are high in height can be obtained as external terminals. Therefore, when the semiconductor device of the present invention is mounted on the mounting board at the final user side, the standoff height between the mounting board and the semiconductor chip can be set to a high value, so that an excellent stress relaxing effect can be achieved.

Further, it is preferable that after the first conductive members of plural semiconductor chips are connected to the metal posts in the step of connecting the first conductive members to the metal posts, the respective semiconductor chips covered by the insulating resin layer may be separated from one another before the step of mounting the metal bumps onto the exposed end faces of the second conductive members.

In this case, after plural semiconductor chips formed on a wafer-like semiconductor substrate are connected to corresponding metal posts at the same time, an insulating resin layer may be coated over the whole surface of the workpiece, and then the manufacturing process for each semiconductor chip is progressed. Therefore, individual semiconductor chips can be shipped under the state that any metal bumps are not mounted thereon. Accordingly, the number of steps can be more greatly reduced and the manufacturing cost can be further reduced as compared with the packaging method of manufacturing semiconductor chips while the respective semiconductor chips are separated from one another in advance. In addition, when a semiconductor device is mounted on a multi-layered board, the metal bumps serving as external terminal electrodes can be suitably mounted at the user side, so that semiconductor devices having higher degree of freedom for users can be achieved.

Further, prior to the step of mounting metal bumps onto the exposed end faces of the second conductive members, it is preferable to form metal thin-film electrodes on the exposed end faces by an electroless Ni/Au plating treatment or an electroless Au plating treatment. In this case, when the semiconductor device is mounted on the mounting board, the processing of forming the external terminal electrodes at the user side can be easily performed.

It is also preferable to use the metal plate comprising one plate member and to form the metal posts and the bottom portion on the one plate member by a half etching treatment or press work. In this case, the temporary board can be easily formed by using one metal plate member and thus the metal posts can be achieved in relatively low cost.

According to a third aspect of the present invention, a method of manufacturing a semiconductor device in which electrode pads exposed from a passivation film formed in a semiconductor chip are connected to corresponding electrodes of a mounting board through metal bumps, is characterized by comprising the steps of: forming on the surface of a metal plate a resist film which is subjected to a patterning treatment for preparing a pattern corresponding to the pattern of the electrode pads of the semiconductor chip; conducting a plating treatment on the metal plate after the formation of the resist film to form plural metal posts on the metal plate, thereby forming a temporary board; connecting first conductive members formed on the electrode pads of the semiconductor chip to the metal posts of the temporary board; disposing an insulating resin having elasticity between the semiconductor chip and the temporary board; removing the metal plate of the temporary board to convert the metal posts into second conductive members whose end faces are exposed from the insulating resin; and mounting the metal bumps on the exposed end faces of the second conductive members.

In the semiconductor device manufacturing method of the present invention, the same effect as the method of the second aspect of the present invention can be achieved. In addition, since the metal posts are formed on the surface of the beforehand-prepared metal plate by plating, a relatively thin sheet-like metal member may be used as the metal plate, and thus the work of removing the metal plate can be extremely easily performed. Further, a well-known plating technique may be applied to the step of forming the metal posts, so that the cost can be further reduced.

It is preferable that the second conductive members are designed in a multi-stage structure and the respective stages are different in coefficient of thermal expansion. In this case, the stress occurring between the semiconductor chip and the mounting board can be stepwise relaxed, and the mounting reliability can be further enhanced.

It is also preferable that the metal plate comprises plural metal layers. In this case, the metal layer serving as a lower layer is formed of material which can be removed by etching, and an upper layer is formed of material which cannot be removed by the etching treatment for the metal layer serving as the lower layer. Accordingly, after the metal layer serving as the lower layer is removed by etching, the remaining metal layer of the upper layer is removed by a polishing work to obtain the metal posts. Therefore, this is effective to a case where the metal posts of the same material as the lower layer of the metal plate are formed on the metal plate by plating.

BRIEF DESCRIPTION OF THE DRAWINGS

FIGS. 10A to 10D are side views showing a semiconductor device having a conventional FCBGA type package structure, wherein

DETAILED DESCRIPTION OF THE PREFERRED EMBODIMENTS

Preferred embodiments according to the present invention will be described hereunder with reference to the accompanying drawings.

FIGS. 1A to 1F and FIGS. 2A to 2C are cross-sectional views showing a manufacturing process of a flip chip type semiconductor device (FCBGA type package) according to a first embodiment of the present invention.

Figure 1A:
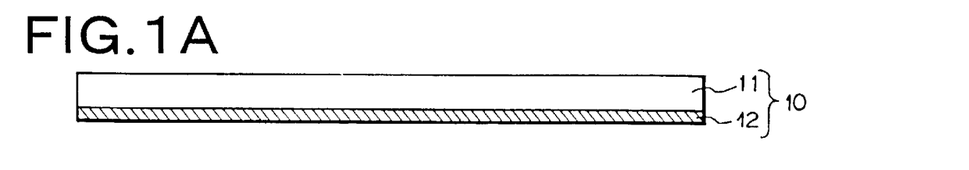
FIGS. 1A to 1F are cross-sectional views which stepwise show a manufacturing process of a semiconductor device according to a first embodiment of the present invention.

First, as shown in FIG. 1A, a first metal layer 11 which is formed of material having excellent solder wettability such as copper (Cu), nickel (Ni) or the like, or metal alloy material mainly containing Cu and/or Ni and processed in a plate shape, and a second metal layer 12 serving as base metal layer are joined to each other to form a clad metal plate 10 having a predetermined shape.

Figure 1B:
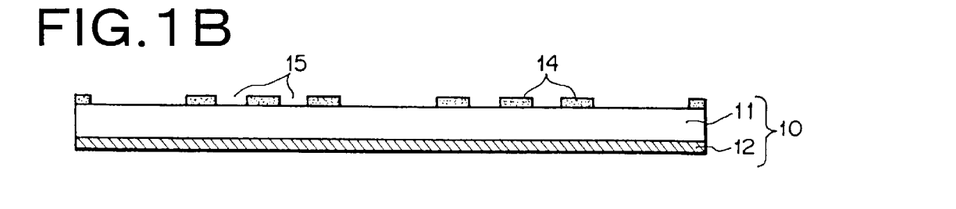

Subsequently, as shown in FIG. 1B, an insulating resist film 14 is coated on the surface of the first metal layer 11, and then subjected to a predetermined patterning treatment to form resist opening portions 15. Here, a photosensitive solder resist film or a photoresist film may be used as the resist film 14. In this case, the resist opening portions 15 can be easily formed by conducting exposure/developing treatments after the coating of the resist film 14.

Figure 1C:
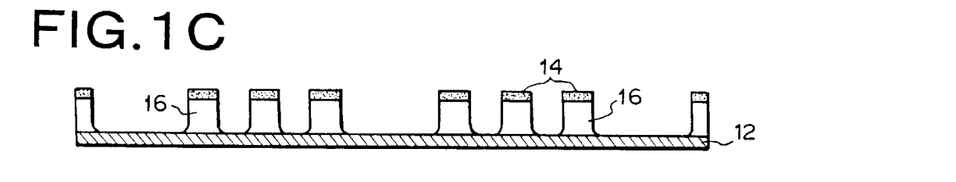

Subsequently, as shown in FIG. 1C, the first metal layer 11 is selectively etched and removed by using as a mask the resist film 14 which has been subjected to the patterning treatment, thereby forming plural metal posts 16 projecting on the second metal layer 12. In this etching treatment, only the first metal layer 11 is removed, and the second metal layer 12 serving as base metal layer is not removed.

Figure 1D:
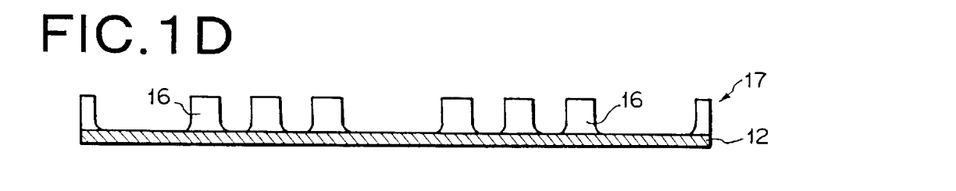

Subsequently, as shown in FIG. 1D, the resist film 14 remaining on each metal post 16 is removed to obtain a temporary board 17.

Figure 1E:
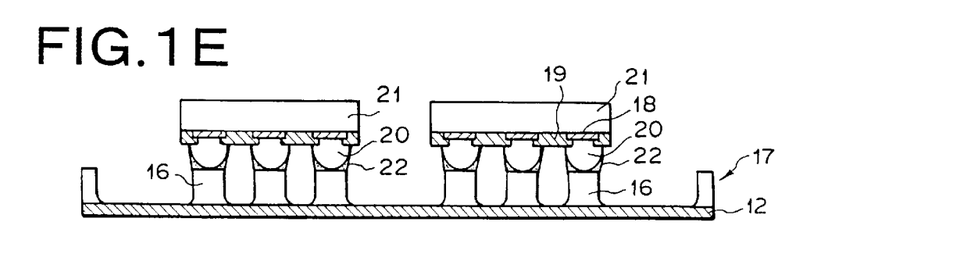

Further, as shown in FIG. 1E, corresponding semiconductor chips 21 are put on the plural metal posts 16 one by one, and electrically and mechanically joined to these metal posts 16. Before this joining step, each semiconductor chip 21 is prepared to have the following structure. That is, plural electrode pads 18 are formed on a semiconductor substrate so as to be arranged in the same pattern as the metal posts 16, and a passivation film 19 is formed around the electrode pads 18 and on the surface of the chip active region. Further, projecting electrode portions (first conductive members) 20 are formed on the electrode pads 18 exposed from the opening portions of the passivation film 19.

The passivation film 19 serves to protect the surroundings of the electrode pads 18 and the surface of the chip active, region, and it is formed of organic film of polyimide (PI) or the like or silicon oxide (SiO$_2$) based inorganic film or the like. The projecting electrode portions 20 are formed of solder mainly containing tin (Sn), lead (Pb) or the like, or conductive material such as Au or the like.

In the above joining or connecting step, when the projecting electrode portions 20 are formed of Au, Cu or the like, after an insulating or conductive paste adhesive material 22 is applied to the projecting electrode portions 20, the projecting electrode portions 20 can be electrically joined to the metal posts 16 by conducting a heating and press-fitting treatment. On the other hand, when the projecting electrode portions 20 are formed of solder, the projecting electrode portions 20 can be electrically joined to the metal posts 16 without using the paste adhesive material 22 by conducting a reflow heating step.

Figure 1F:
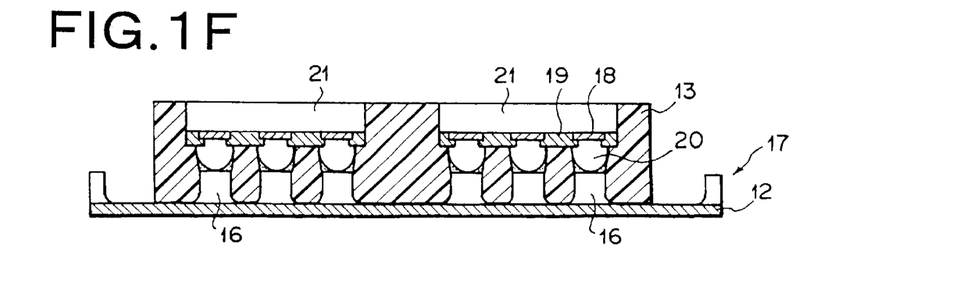

Subsequently, as shown in FIG. 1F, an insulating resin layer 13 having elasticity is filled between the semiconductor chips 21 and the temporary board 17 and around the semiconductor chips 21, and then hardened. In this case, the semiconductor chips 21 can be protected from the mechanical stress and the chemical stress by the insulating resin layer 13 which covers the passivation film 19 and from the opening portions of which the electrode pads 18 are exposed. When the insulating resin layer 13 is filled, there may be used a method of filling under fill resin by using the capillary phenomenon or a method of filling the insulating resin layer 13 by using a resin forcing technique such as an injection sealing technique, a transfer sealing technique or the like. In place of the insulating resin (13), insulating stress-relaxing resin may be filled and hardened by the same method as described above to achieve the same action and effect as described above.

As the insulating resin 13 and the insulating stress-relaxing resin may be used material which mainly contains epoxy resin, silicone resin, polyimide resin, polyolefine resin, cyanate ester resin, phenol resin, naphthalene resin or fluorene resin.

Figure 2A:
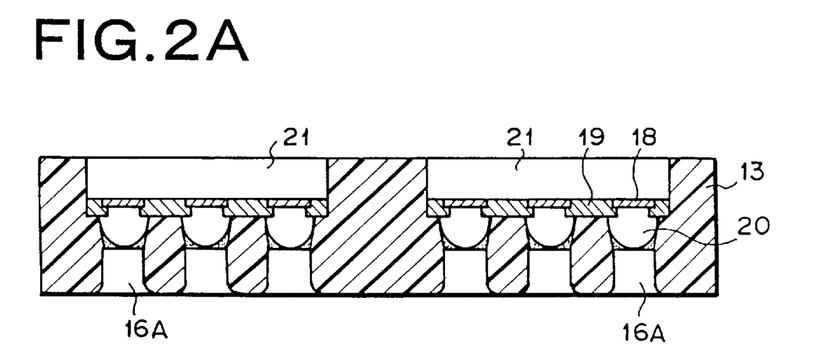
FIGS. 2A to 2C are cross-sectional views which stepwise show a manufacturing process of a semiconductor device according to the first embodiment of the present invention.

Subsequently, as shown in FIG. 2A, only the second metal layer 12 serving as the base metal layer is removed by the etching or polishing technique to expose the faces of the lower portions of the metal posts 16 from the surface of the insulating resin layer 13 (or the insulating stress-relaxing resin), thereby forming post electrode portions (second conductive members) 16A, that is, converting the metal posts 16 into the second conductive members 16A.

Figure 2B:
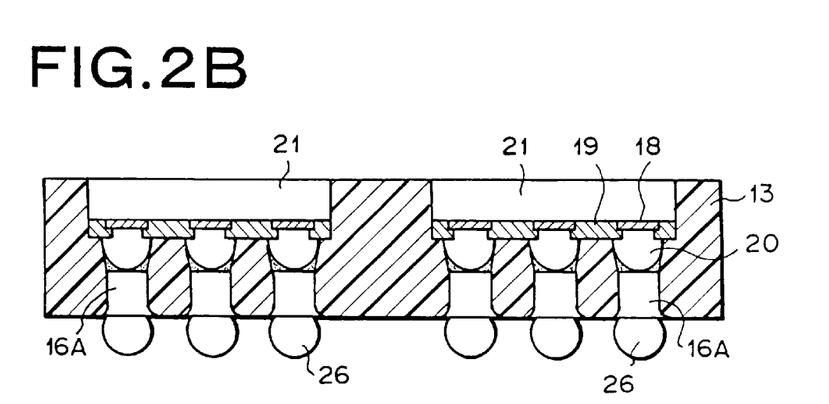

Subsequently, as shown in FIG. 2B, metal bumps 26 serving as external terminals are mounted on the respective end faces of the plural post electrode portions 16A exposed from the insulating resin layer 13. When the metal bumps 26 are formed of solder balls, it is preferable that metal thin film of Au, Ni/Au or the like is formed on the exposed end faces of the post electrode portions 16A by using the electroless plating technique in consideration of the fixing property of the solder ball. In this case, when the metal bumps 26 are fixed to the exposed end faces of the post electrode portions 16A, the workpiece is passed through a heating/reflow step using flux.

Figure 2C:
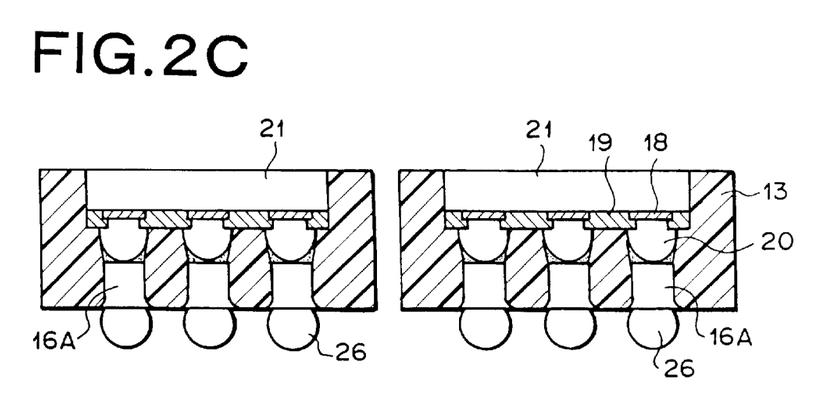

Subsequently, as shown in FIG. 2C, the mutually linked semiconductor chips 21 are separated from one another by using a dicing blade (not shown) to obtain flip chip type semiconductor devices.

In this embodiment, although the under fill resin is not provided between the semiconductor chip 21 and the multi-layered wiring board, the insulating resin layer 13 is formed on the passivation film 19 and the deforming stress acting on the metal bumps 26 can be effectively absorbed/relaxed by the projecting electrode portions 20 and the post electrode portions 16A both embedded in the insulating resin layer 13.

As described above, the semiconductor device of this embodiment has the protection film structure that the insulating resin layer 13 is formed on the passivation film 19. Therefore, the passivation film 19 and the active region surface below the passivation film 19 can be surely protected from damages on the peripheral devices containing the multi-layered wiring board, etc. due to heat and mechanical stress occurring in the recycling step, and the recycling step of the semiconductor chips 21 when cheap multi-layered wiring boards of organic material are used can be implemented, thereby reducing the manufacturing cost of the semiconductor device.

Further, in the semiconductor device of this embodiment, the external terminals conducted to the semiconductor chip 21 are formed by combining the projecting electrode portions 20, the post electrode portions 16A and the metal bumps 26, so that the external terminals are designed as high structures. Accordingly, when the semiconductor device of the present invention is mounted on the multi-layered wiring board at the final user side, the standoff height between the multi-layered wiring board and the semiconductor chip 21 is set to a high value, so that an excellent stress relaxing effect is achieved and the mounting reliability of the package is further enhanced. Further, the insulating resin layer 13 is formed on the overall surface of the temporary board 17, the manufacturing process is advanced while the respective semiconductor chips 21 are linked to one another, and plural packages which are mutually separated from one another at the last stage are obtained. Therefore, as compared with the method of manufacturing packages under the state that the individual packages are separated from one another in advance, the number of steps can be more greatly reduced and the manufacturing cost can be more greatly lowered.

Figure 3:
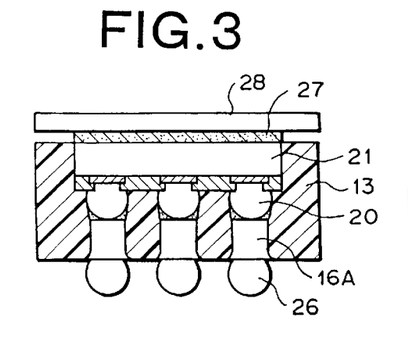
FIG. 3 is a cross-sectional view showing a case where a heat spreader is fixed to the back surface of a semiconductor chip according to the first embodiment of the present invention.

The flip chip type semiconductor device is generally applied to a multi-pin/high speed type device. In this case, it is a critical problem where to disperse the heat occurring in the semiconductor chip 21. In order to solve this problem, a heat spreader 28 may be fixed to the exposed surface (back surface) of the semiconductor chip 21 of FIG. 2C from the insulating resin layer 13 by heat dissipating adhesive agent 27 as shown in FIG. 3 which shows the state that the semiconductor device is completed. With the heat spreader 28, the heat can be mainly radiated from the back surface of the semiconductor chip 21, and thus the heat dissipating characteristic of the flip chip type semiconductor device is enhanced.

In order to enhance thermal conductivity, the heat spreader 28 is formed of material mainly containing metal material of Cu, aluminum (Al), tungsten (W), molybdenum (Mo), iron (Fe), Ni or chromium (Cr), or ceramic material of alumina, aluminum nitride (AlN), silicon carbide (SiC), boron nitride (BN) or mullite.

The heat dissipating adhesive agent 27 may be formed of material mainly containing epoxy resin, silicone resin, polyimide resin, polyolefine resin, cyanate ester resin, phenol resin, naphthalene resin or fluorene resin, or material containing Ag, Pd, Cu, Al, Au, Mo, W, diamond, alumina, AlN, mullite, BN or SiC.

Figure 4:
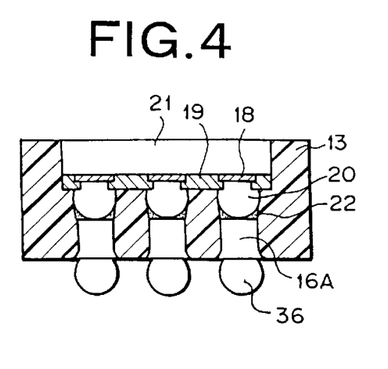
FIG. 4 is a cross-sectional view showing a modification in which metal bumps whose expansion coefficient is adjusted are disposed on the semiconductor device according to the first embodiment of the present invention.

As shown in FIG. 4, the metal bumps 26 of the semiconductor device of the first embodiment of FIG. 2C may be replaced by metal bumps 36 which are adjusted in expansion coefficient. In the modification shown in FIG. 4, the metal bumps 36 as external terminals are formed of solder mixed with Ag or the like, and the coefficient of expansion of the metal bumps 36 can be approached to that of the multi-layered wiring board by properly setting the concentration of Ag in the solder, whereby the stress occurring between the metal bumps 36 and the multi-layered wiring board can be moderated and the mounting reliability of the flip chip type semiconductor device can be further enhanced. According to this modification, in consideration of the fixing property of the metal bumps 36, metal thin film of Au, Ni/Au or the like may be formed on the exposed end faces of the post electrode portions 16A by using the electroless plating technique.

Next, a second embodiment of the present invention will be described.

Figure 5A:
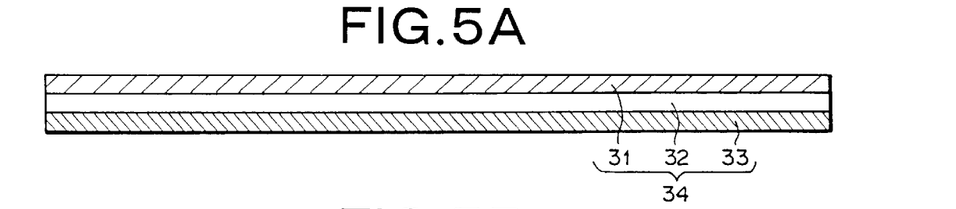
FIGS. 5A to 5C are cross-sectional views showing a manufacturing process of a semiconductor device according to a second embodiment of the present invention.
Figure 5B:
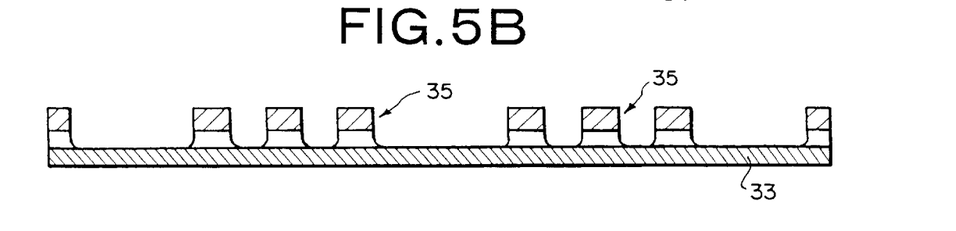
Figure 5C:
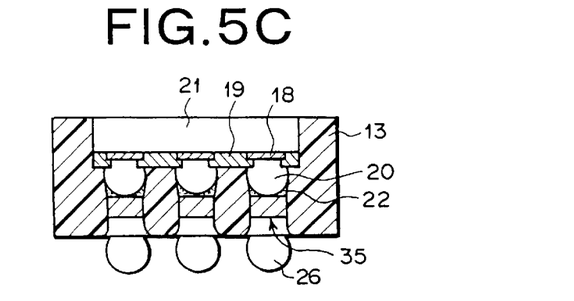

FIGS. 5A to 5C are cross-sectional views showing a manufacturing process of a flip chip type semiconductor device according to this embodiment.

First, as shown in FIG. 5A, a first metal layer 31, a second metal layer 32 and a third metal layer 33 serving as a base metal layer, these layers being shaped like a plate, are joined to one another to form a clad metal plate 34 having a predetermined shape. Each of the first metal layer 31 and the second metal layer 32 is formed of material having excellent solder wettability, such as metal of Cu, Ni or the like, or metal alloy material mainly containing Cu and Ni or the like, and these layers 31 and 32 having different coefficients of thermal expansion.

Subsequently, in the same manner as shown in FIGS. 1B and 1C of the first embodiment, metal posts 35 each having a two-stage structure including the first metal layer 31 and the second metal layer 32 are achieved on the third metal layer 33 serving as the base metal layer as shown in FIG. 5B.

Further, a flip chip type semiconductor device shown in FIG. 5C is achieved in the same manner as shown in FIGS. 1E to 2C. This semiconductor device has the post electrode portions 35 having the two-layered structure comprising the materials having the different coefficients of thermal expansion, so that the stress occurring between the semiconductor chip 21 and the multi-layered wiring board can be stepwise relaxed and thus a flip chip type semiconductor device having more enhanced mounting reliability can be achieved. The number of the metal layers constituting the post electrode portions 35 is not limited to the two layers, and it may be set to three layers or more.

Next, a third embodiment of the present invention will be described. FIGS. 6A to 6E are cross-sectional views showing a manufacturing process of a flip chip type semiconductor device according to this embodiment. In the manufacturing method of this embodiment, the same steps as the steps of FIGS. 1A to 2A of the first embodiment are executed.

Figure 6A:
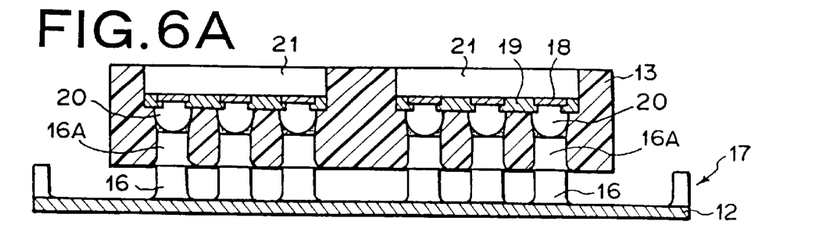
FIGS. 6A to 6E are cross-sectional views showing a manufacturing process of a semiconductor device according to a third embodiment of the present invention.

Subsequently to the step of FIG. 2A, a temporary board 17 achieved in the same step as shown in FIG. 1D of the first embodiment is separately prepared. Then, as shown in FIG. 6A, plural metal posts 16 of the temporary board 17 are electrically and mechanically joined to the post electrode portions 16A disposed in the same pattern arrangement as the metal posts 16 by using paste adhesive agent or the like.

Figure 6B:
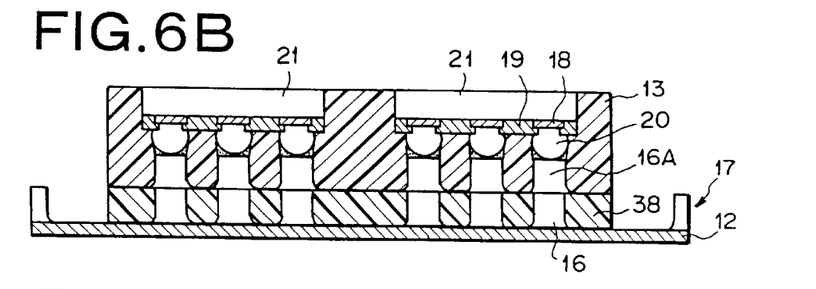

Subsequently, as shown in FIG. 6B, insulating stress-relaxing resin layer 38 having elasticity is filled and hardened between the integral portion of the plural semiconductor chips 21 unified by the insulating resin layer 13 and the temporary board 17 and around the metal posts 16 to protect the metal posts from the mechanical stress and the chemical stress. When the insulating stress-relaxing resin layer 38 is liquid, it may be filled by a method using the capillary phenomenon, a spin coating method or a curtain coating method. On the other hand, when the insulating stress-relaxing resin 38 is solid, it may be disposed around the metal posts 16 by using a transfer sealing method.

Figure 6C:
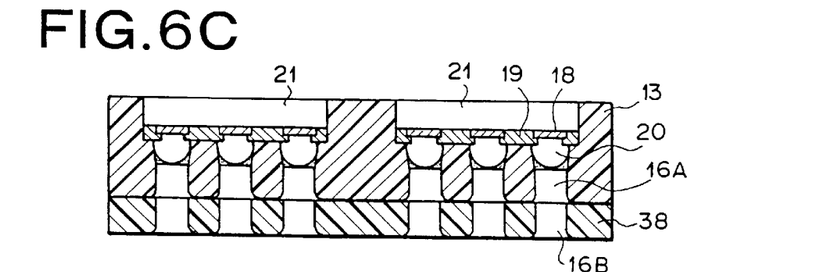

Subsequently, as shown in FIG. 6C, only the second metal layer 12 serving as the bottom portion of the temporary board. 17 is removed by the etching or polishing technique in the same step as shown in FIG. 2A of the first embodiment to expose the faces of the lower portions of the metal posts 16 from the surface of the insulating stress-relaxing resin layer 38, thereby forming post electrode portions 16B.

Figure 6D:
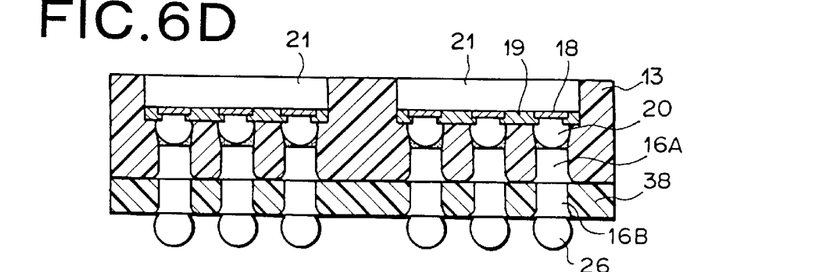

Further, as shown in FIG. 6D, metal bumps 26 serving as external terminals are mounted on the respective end portions of the plural post electrode portions 16B exposed from the insulating stress-relaxing resin layer 38.

Figure 6E:
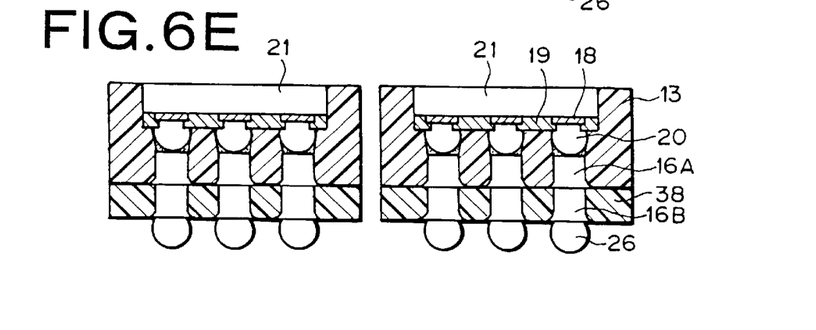

Subsequently, as shown in FIG. 6E, the semiconductor chips 21 which are linked to one another are separated from one another by using a dicing blade (not shown), thereby achieving a flip chip type semiconductor device.

In this embodiment, the insulating resin layer 13 is formed on the passivation film 19 of the semiconductor chip 21 and then the insulating stress-relaxing resin layer 38 is formed on the insulating resin layer 13 to thereby achieve the protection film having two-layered structure. Therefore, there can be obtained such a flip chip type semiconductor device that the passivation film 19 and the surface of the active region below the passivation film 19 can be more surely protected from the heat and mechanical stress occurring in the recycling process and the recycling process can be easily performed.

Further, in this embodiment, the metal posts 16A, 16B are arranged in a multi-stage structure, and thus structures which are high in height can be obtained as the outer terminals. Therefore,. when the flip chip type semiconductor device of this embodiment is mounted on a multi-layered wiring board at the final user side, the standoff height between the multi-layered wiring board and the semiconductor chip 21 can be increased to achieve an excellent stress-relaxing effect, and thus the mounting reliability of the package can be enhanced.

Next, a fourth embodiment of the present invention will be described.

Figure 7A:
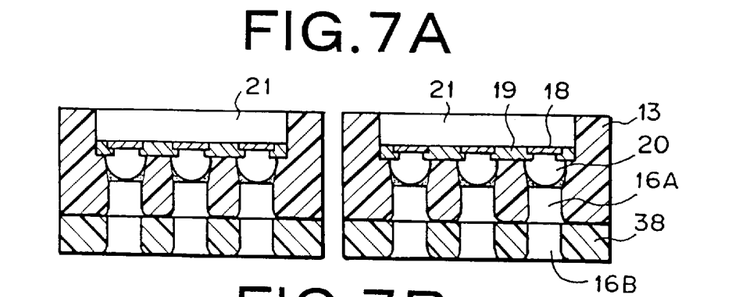
FIGS. 7A and 7B are cross-sectional views showing a manufacturing process of a semiconductor device according to a fourth embodiment of the present invention.
Figure 7B:
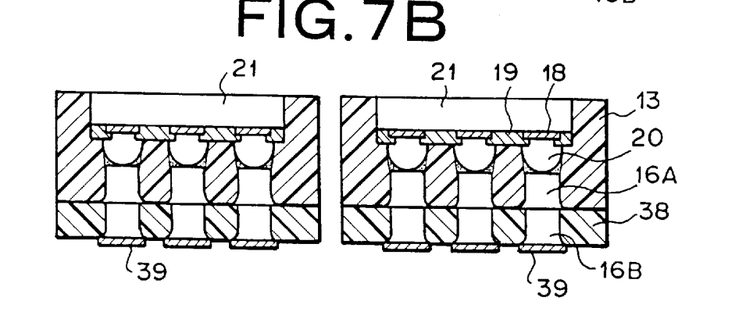

FIGS. 7A and 7B are cross-sectional views showing a manufacturing process of a flip chip type semiconductor device according to this embodiment. In the manufacturing method of this embodiment, the same steps as the steps of FIGS. 6A to 6C of the third embodiment are executed.

Subsequently to the step of FIG. 6C, the semiconductor chips 21 which are mutually linked to one another are separated from one another by using a dicing blade (not shown) before the external terminals are mounted.

Thereafter, in consideration of the connection work to the external terminal electrodes which is carried out at the user side, metal thin film electrodes 39 of Au, alloy of Ni and Au, or the like are formed on the end faces of the post electrode portions 16B exposed from the insulating stress-relaxing resin layer 38 by using the plating technique such as electroless Au plating, electroless Ni/Au plating, or the like.

According to this embodiment, when the semiconductor device is mounted on the multi-layered wiring board, the external terminal electrodes can be suitably formed at the user side, and thus a flip chip type semiconductor which is high in degree of freedom for users can be achieved.

Next, a fifth embodiment of the present invention will be described.

Figure 8A:
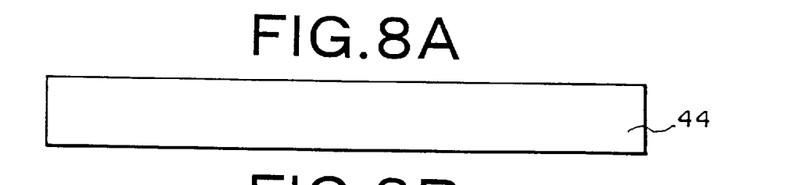
FIGS. 8A and 8B are cross-sectional views showing a manufacturing process of a semiconductor device according to a fifth embodiment of the present invention.
Figure 8B:
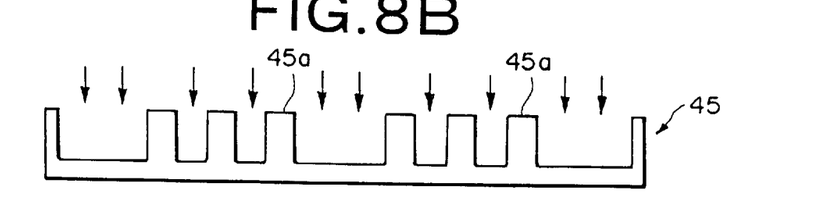

FIGS. 8A and 8B are cross-sectional views showing a manufacturing process of a flip chip semiconductor device according to this embodiment. In the manufacturing method of this embodiment, a single-layer metal plate 44 having a predetermined shape is prepared as shown in FIG. 8A. Further, as shown in FIG. 8B, plural metal posts 45a are formed on the surface of the single-layer metal plate 44 by half etching or press working to obtain a single-layer temporary board 45. Thereafter, the same semiconductor chip mounting steps as the steps of FIGS. 1E to 2C of the first embodiment are carried out.

In the above embodiment, the temporary board 45 can be relatively easily formed by using the single-layer metal plate 44. Therefore, as compared with the first embodiment in which the clad member 10 is formed by separately preparing the first metal layer 11 and the second metal layer 12, the temporary board 45 having the post electrode portions can be obtained at a lower cost, and thus a cheaper flip chip type semiconductor device can be supplied.

Next, a sixth embodiment of the present invention will be described.

Figure 9:
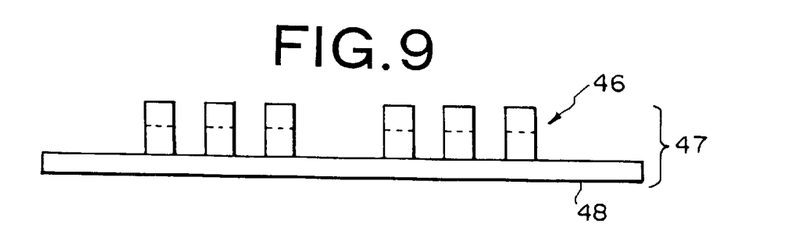
FIG. 9 is a cross-sectional view showing a manufacturing process of a semiconductor device according to a sixth embodiment of the present invention.

FIG. 9 is a cross-sectional view showing a manufacturing process of a flip chip type semiconductor device according to this embodiment. In this embodiment, the surface of a metal plate 48 having a predetermined shape is coated with a resist film (not shown), and then the resist film is subjected to a patterning treatment so as to meet the pattern of the electrode pads of the semiconductor chip as shown in FIG. 9. Subsequently, plural metal posts 46 of Ni or the like are deposited on the metal plate 48 by a predetermined plating technique to obtain a temporary board 47. The height of the metal posts 46 is suitably varied by adjusting the plating time or the like. Thereafter, the same semiconductor mounting step as the first embodiment is carried out.

In this embodiment, the metal posts 46 are formed on the surface of the beforehand prepared metal plate 48 by the plating technique. Therefore, a relatively thin sheet-like metal member may be used as the metal plate 48 which should be finally removed by the etching treatment or the polishing work. Accordingly, the step of removing the metal plate 48 to convert the metal posts 46 into the post electrode portions can be extremely easily performed. Further, the conventional plating technique is applied to the step of forming the metal posts 46 so that the cost can be further reduced.

Further, as indicated by a broken line in FIG. 9, each of the metal posts 46 may be designed in a two-stage structure comprising different metal plating layers. In this case, if the respective stages may be formed of materials having different coefficients of thermal expansion, the stress occurring between the semiconductor chip and the multi-layered wiring board can be stepwise relaxed, and the mounting reliability can be further enhanced.

Still further, when the metal plate 48 is formed of a single layer, the metal plate 48 is perfectly removed by only the etching treatment or polishing work. However, when a clad member comprising plural metal layers is used as the metal plate 48, the removing step can be stepwise carried out. This is effective to a case where the metal posts 46 of the same material as a lower layer of the metal plate 48 are formed by the plating. For example, the metal layer of the lower layer is formed of Cu which can be removed by etching, and the metal layer of an upper layer is formed of Ni which cannot be removed by etching. In this case, after the metal layer of the lower layer is removed by etching, the remaining metal layer of the upper layer is removed by the polishing work, thereby obtaining the post electrode portions formed of Cu.

The semiconductor device and the method of manufacturing the same according to the present invention are not limited to those of the above-described embodiments, and various corrections and modifications may be made to these embodiments without departing from the subject matter of the present invention.

As described above, according to the semiconductor device and the manufacturing method of the present invention, the deforming stress acting on the metal bumps is moderated and thus the mounting reliability is enhanced irrespective of no provision of the under fill resin between the semiconductor chip and the mounting board. In addition, the damages on the peripheral devices containing the mounting board, etc. in the recycling process can be avoided, and the cost can be reduced.

What is claimed is:

1. A semiconductor device, comprising:
   a semiconductor chip;
   electrode pads formed on said semiconductor chip;
   metal bumps connected to said electrode pads;
   a passivation film which is formed on said semiconductor chip and has opening portions through which said electrode pads are exposed;
   first conductive members whose one end faces are connected to said electrode pads through said opening portions;
   second conductive members through which the other end faces of said first conductive members and said metal bumps are connected to one another; and
   an insulating resin layer having elasticity which covers said first conductive members, said second conductive members and said passivation film with the exception of the end faces of said second conductive members.

2. The semiconductor device as claimed in claim 1, wherein said metal bumps are formed of solder added with metal materials containing Ag.

3. The semiconductor device as claimed in claim 1, wherein each of said second conductive members is designed in a multi-stage structure having plural stages which are different in coefficient of thermal expansion from one another.

4. The semiconductor device as claimed in claim 1, wherein each of said second conductive members is designed in a multi-stage structure having plural stages and said insulating resin layer is designed in a multi-layer structure, the respective stages of each of said second conductive member being covered by the respective layers of said insulating resin layer.

5. The semiconductor device as claimed in claim 4, wherein said insulating resin layer covering said second conductive members at the first stage which are brought into contact with the other end faces of said first conductive members are formed of material mainly containing epoxy resin, silicone resin, polyimide resin, polyolefine resin, cyanate ester resin, phenol resin, naphthalene resin or fluorene resin.

6. The semiconductor device as claimed in claim 5, wherein said insulating resin layer covering said second conductive members at the second and higher stages subsequent to the first stage are formed of an insulating stress-relaxing resin mainly containing epoxy resin, silicone resin, polyimide resin, polyolefine resin, cyanate ester resin, phenol resin, naphthalene resin or fluorene resin.

7. The semiconductor device as claimed in claim 1, wherein a heat spreader is fixed to the opposite surface to the electrode-pad forming surface of said semiconductor chip through heat dissipating adhesive agent.

8. The semiconductor device as claimed in claim 7, wherein said heat spreader is formed of metal material containing Cu, Al, W, Mo, Fe, Ni or Cr as a main component.

9. The semiconductor device as claimed in claim 7, wherein said heat spreader is formed of ceramic material containing alumina, AlN, SiC, BN or mullite.

10. The semiconductor device as claimed in claim 7, wherein the heat dissipating adhesive agent is formed of material mainly containing epoxy resin, silicone resin, polyimide resin, polyolefine resin, cyanate ester resin, phenol resin, naphthalene resin or fluorene resin.

11. The semiconductor device as claimed in claim 7, wherein the heat dissipating adhesive agent is formed of material containing Ag, Pd, Cu, Al, Au, Mo, W, diamond, alumina, AlN, mullite, BN or SiC.

* * * * *